US009620598B2

(12) United States Patent
Liu et al.

(10) Patent No.: US 9,620,598 B2
(45) Date of Patent: Apr. 11, 2017

(54) ELECTRONIC DEVICE INCLUDING A CHANNEL LAYER INCLUDING GALLIUM NITRIDE

(71) Applicant: Semiconductor Components Industries, LLC, Phoenix, AZ (US)

(72) Inventors: Chun-Li Liu, Scottsdale, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/741,567

(22) Filed: Jun. 17, 2015

(65) Prior Publication Data
US 2016/0043181 A1  Feb. 11, 2016

Related U.S. Application Data (60) Provisional application No. 62/033,393, filed on Aug. 5, 2014.

(51) Int. Cl.
*H01L 29/15* (2006.01)
*H01L 29/20* (2006.01)
(Continued)

(52) U.S. Cl.
CPC ...... *H01L 29/2003* (2013.01); *H01L 29/1083* (2013.01); *H01L 29/7783* (2013.01);
(Continued)

(58) Field of Classification Search
CPC ........ H01L 29/20; H01L 29/06; H01L 29/786
See application file for complete search history.

(56) References Cited

U.S. PATENT DOCUMENTS 6,541,797 B1 * 4/2003 Udagawa ............... H01L 33/32
257/101
7,456,442 B2  11/2008 Munns
(Continued)

FOREIGN PATENT DOCUMENTS

EP  2538446 A2  12/2012

OTHER PUBLICATIONS

Maeda, Narihiko et al., "Enhanced Electron Mobility in AlGaN/InGaN/AlGaN Double-Heterostructures by Piezoelectric Effect," Japanese Journal of Applied Physics, vol. 38, Part 2, No. 7B, dated Jul. 15, 1999, pp. L799-L801.
(Continued)

*Primary Examiner* — Caleb Henry
(74) *Attorney, Agent, or Firm* — Abel Law Group, LLP (57) ABSTRACT

An electronic device can transistor having a channel layer that includes a compound semiconductor material. In an embodiment, the channel layer overlies a semiconductor layer that includes a carrier barrier region and a carrier accumulation region. The charge barrier region can help to reduce the likelihood that de-trapped carriers from the channel layer will enter the charge barrier region, and the charge accumulation region can help to repel carriers in the channel layer away from the charge barrier layer. In another embodiment, a barrier layer overlies the channel layer. Embodiments described herein may help to produce lower dynamic on-resistance, lower leakage current, another beneficial effect, or any combination thereof.

20 Claims, 5 Drawing Sheets (51) Int. Cl.
  *H01L 29/786* (2006.01)
  *H01L 29/778* (2006.01)
  *H01L 29/10* (2006.01)
  *H01L 29/40* (2006.01)
  *H01L 29/423* (2006.01)

(52) U.S. Cl.
  CPC .. *H01L 29/78681* (2013.01); *H01L 29/78696* (2013.01); *H01L 29/404* (2013.01); *H01L 29/42376* (2013.01)

(56) References Cited

U.S. PATENT DOCUMENTS

| | | | |
|---|---|---|---|
| 7,586,156 B2 | 9/2009 | Yedinak et al. | |
| 7,635,877 B2* | 12/2009 | Waki | H01L 21/28575 257/192 |
| 7,795,622 B2* | 9/2010 | Kikkawa | H01L 29/7783 257/190 |
| 7,859,057 B2 | 12/2010 | Yedinak et al. | |
| 8,017,978 B2 | 9/2011 | Lidow et al. | |
| 8,357,976 B2 | 1/2013 | Yedinak et al. | |
| 8,368,120 B2 | 2/2013 | Lidow et al. | |
| 8,426,892 B2* | 4/2013 | Imanishi | H01L 21/02378 257/192 |
| 8,575,660 B2 | 11/2013 | Nelson et al. | |
| 8,648,389 B2* | 2/2014 | Makabe | H01L 21/02378 257/194 |
| 8,653,563 B2* | 2/2014 | Yamada | H01L 29/7787 257/183 |
| 8,816,396 B2* | 8/2014 | Hwang | H01L 29/66462 257/194 |
| 2002/0167023 A1* | 11/2002 | Chavarkar | H01L 29/7783 257/194 |
| 2003/0218183 A1* | 11/2003 | Micovic | H01L 21/28575 257/192 |
| 2005/0051804 A1* | 3/2005 | Yoshida | H01L 29/155 257/213 |
| 2005/0263791 A1* | 12/2005 | Yanagihara | H01L 29/155 257/194 |
| 2006/0054929 A1* | 3/2006 | Nakayama | H01L 29/7783 257/197 |
| 2006/0255364 A1* | 11/2006 | Saxler | H01L 29/2003 257/192 |
| 2006/0261370 A1* | 11/2006 | Hoke | H01L 29/7787 257/194 |
| 2008/0116492 A1* | 5/2008 | Wu | H01L 29/2003 257/213 |
| 2008/0258135 A1* | 10/2008 | Hoke | H01L 29/201 257/23 |
| 2009/0045438 A1* | 2/2009 | Inoue | H01L 29/155 257/192 |
| 2011/0006345 A1* | 1/2011 | Ota | H01L 29/0657 257/192 |
| 2013/0069208 A1 | 3/2013 | Briere | |
| 2013/0292690 A1* | 11/2013 | Ando | H01L 29/432 257/76 |

OTHER PUBLICATIONS

Tanaka, Kenichiro et al., "Effects of Deep Trapping States at High Temperatures on Transient Performance of AlGan/GaN Heterostructure Field-Effect Transistors," Japanese Journal of Applied Physics, vol. 52, dated 2013, pp. 04CF07-1 through 04CF07-5.

* cited by examiner

ELECTRONIC DEVICE INCLUDING A CHANNEL LAYER INCLUDING GALLIUM NITRIDE

CROSS-REFERENCE TO RELATED APPLICATION

This application claims priority under 35 U.S.C. §119(e) to U.S. Provisional Patent Application No. 62/033,393 entitled "Electronic Device Including a Channel Layer Including a Compound Semiconductor Material," by Liu et al., filed Aug. 5, 2014, which is assigned to the current assignee hereof and incorporated herein by reference in its entirety.

FIELD OF THE DISCLOSURE

The present disclosure relates to electronic devices, and more particularly to, electronic devices including channel layers having compound semiconductor materials.

RELATED ART

Microelectronic devices, such as transistors, diodes, and other microelectronic devices can be formed with a compound semiconductor material, such as SiC, GaN, InP, CdTe, etc. that allows such microelectronic devices to be operated at relatively higher temperatures, higher breakdown voltages, lower on-resistance, thus higher efficiency as compared to their Si-based counterparts.

A transistor can have a channel layer that includes a compound semiconductor material, such as GaN. Such transistor can have an dynamic on-resistance ($R_{DSON}$) that is dramatically higher at a higher temperature, such as at 150° C., during the on and off switching operations, as compared to about room temperature (25° C.). At the higher temperature, dynamic $R_{DSON}$ can increase as the voltage difference between the drain and source ($V_{DS}$) increases. High dynamic $R_{DSON}$ is undesired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" intended to mean a semiconductor material that includes at least two different elements. Examples include SiC, SiGe, GaN, InP, $Al_aGa_{(1-a)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element. A II-VI semiconductor material is intended to mean a semiconductor material that includes at least one divalent metal element and at least one Group 16 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Unless stated explicitly to the contrary, the terms "carrier impurity concentration" or "concentration of a carrier impurity", when referring to a layer or a region, is intended to mean an average concentration for such layer or region.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word approximately or substantially is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor having a channel layer. In an embodiment, the electronic device can include a back barrier to confine carriers within the channel layer. The back barrier can include a material with larger band gap than the material of the channel layer. An example would be the channel is made of GaN, and back barrier is $Al_xGa_{(1-x)}N$, wherein $0<x<1$. In a particular embodiment, the channel layer can be doped with carrier impurities, such as acceptors or donors. In another embodiment, the electronic device can include a layer that is closer to the channel layer, and another layer that is farther from the channel layer. The layer closer to the channel layer can be a carrier barrier that reduces the likelihood that carriers will enter the semiconductor layer, and the layer farther from the channel layer can be a carrier accumulation layer, such that if a carrier passes from the channel layer through the carrier barrier layer, the carrier can be held in the carrier accumulation layer, which can help reduce leakage current.

Without being bound by theory, carrier impurity atoms can be carrier traps that trap carriers. As the temperature and electric field increase, some of carriers within the carrier traps become de-trapped. The carrier barrier layer has less carrier trapping sites as compared to a conventional superlattice structure that may contact the channel layer. Thus, the carriers are more likely to be confined within the channel layer by higher bandgap energy. The carrier accumulation layer may have relatively more carrier traps than the carrier barrier layer. Thus, if de-trapped carriers pass from the channel layer through the carrier barrier layer or are emitted from the carrier barrier layer, the de-trapped carriers can pass to the charge accumulation layer. In a particular embodiment, the charge accumulation layer has a greater concentration of carrier impurities, and therefore, can trap the carriers within the carrier traps. Such an embodiment may reduce leakage current when the transistor is off.

In a particular embodiment, an electronic device can include a substrate, a carrier accumulation layer overlying the substrate, a carrier barrier layer overlying the carrier accumulation layer, and a channel layer of a transistor overlying the carrier barrier layer. The channel layer can include a compound semiconductor material and have a thickness in a range of 50 nm to 550 nm. In another particular embodiment, an electronic device can include a substrate, a carrier accumulation region overlying the substrate, a carrier barrier layer overlying the carrier accumulation layer, and a channel layer of a transistor overlying the carrier barrier layer. The channel layer can include GaN. The carrier accumulation layer, the carrier barrier layer, or each of the carrier accumulation layer and the carrier barrier layer can include $Al_xGa_{(1-x)}N$, wherein x is in a range of 0.08 to 0.12.

The concepts as disclosed herein may be useful for transistors having channel layers that include compound semiconductor materials. The compound semiconductor material can include two different Group 14 elements, such as SiC, SiGe, or the like; a III-V semiconductor material, such as a Group 13-Group 15 semiconductor material (GaN, InP, GaAs, $Al_aGa_{(1-a)}N$, $Al_aIn_bGa_{(1-a-b)}N$, etc., a III-N semiconductor material, or the like; or a II-VI semiconductor material, such as ZnO, CdSe, or the like.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

Figure 1:
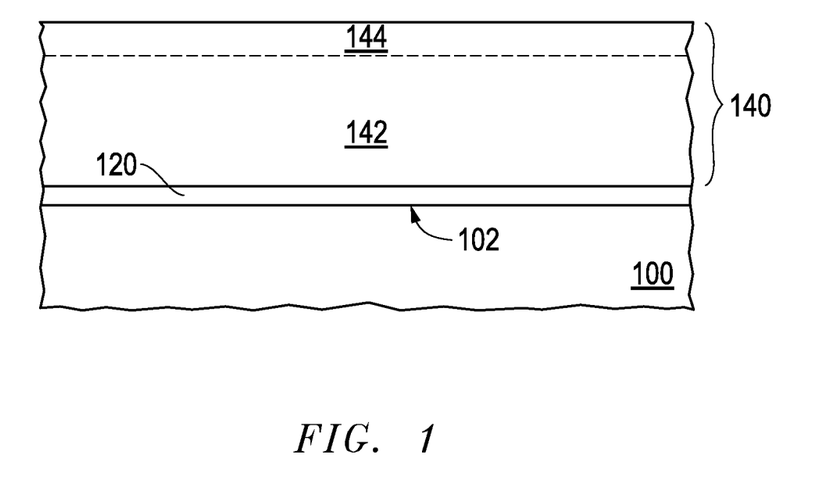
FIG. 1 includes an illustration of a cross-sectional view of a portion of a workpiece including a substrate, a nucleation layer, and a superlattice structure.

FIG. 1 includes an illustration of a cross-sectional view of a portion of a workpiece that includes a substrate 100, a nucleation layer 120, and a superlattice structure 140. The substrate 100 has a primary surface 102 and can include silicon, GaN, diamond, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface 102 can be selected depending upon the composition of the superlattice structure 140 that will be subsequently formed over the substrate 100. The nucleation layer 120 can help to epitaxially grow the superlattice structure 140. In an embodiment, the nucleation layer 120 may include one or more elements that are common to the subsequently formed superlattice structure 140. In a particular embodiment, the nucleation layer can include aluminum nitride when an aluminum-containing superlattice structure 140 is being formed over the nucleation layer 120. The thickness of the nucleating layer can be in a range of 20 nm to 1000 nm.

The superlattice structure 140 can include a plurality of films. The composition of the films may depend on the voltage at which the electronic device operates, the composition of the subsequently-formed channel layer, or both. The overall thickness of the superlattice structure can be in a range of 0.1 micron to 100 microns. In a particular embodiment, the overall thickness is in a range of 1 micron to 10 microns. As the operating voltage increases, the complexity and overall thickness of the superlattice structure can increase. With respect to the composition of the channel layer, in an embodiment, the channel layer includes GaN, and superlattice structure includes $Al_zGa_{(1-z)}N$, where $0 \leq z \leq 1$. In a particular embodiment, the content of Al decreases and the content of Ga content increases as the distance from the nucleation layer 120 increases.

In the embodiment as illustrated, the superlattice structure 140 includes a lower region 142 and an upper region 144. Each of the lower and upper regions 142 and 144 can include a single film, a plurality of films, or be part of a larger film. The significance of the regions, and the upper region 144 in particular, will become more apparent when describing design considerations and alternative embodiments later in this specification.

Figure 2:
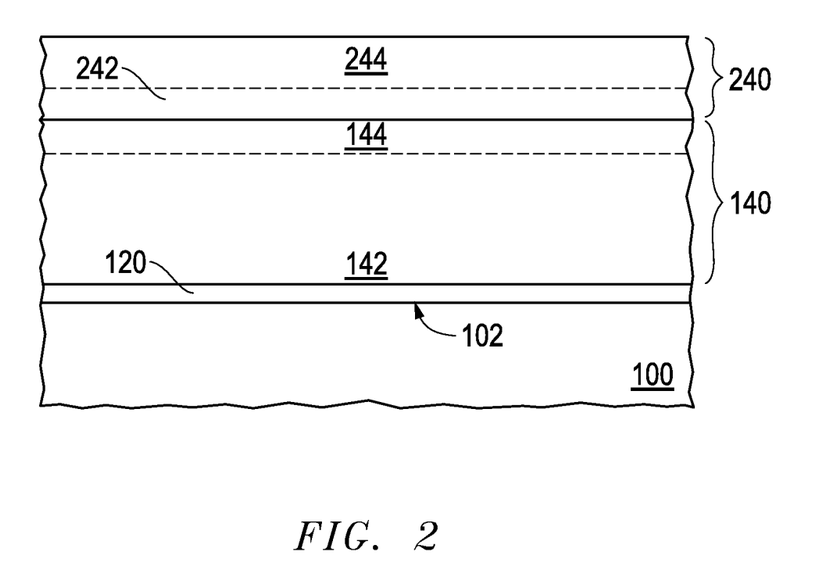
FIG. 2 includes an illustration of a cross-sectional view of the workpiece of FIG. 1 after forming a semiconductor layer over the superlattice structure.

In FIG. 2, a semiconductor layer 240 is formed over the superlattice structure 140. The semiconductor layer 240 can be a back barrier with a larger band gap to confine carriers, such as electrons or holes, within a subsequently-formed channel layer. The semiconductor layer 240 includes a charge accumulation layer 242 that is closer to the superlattice structure 140 and a charge barrier layer 244 that is closer to the subsequently-formed channel layer. In a particular embodiment, the charge accumulation layer 242 abuts the region 144 of the superlattice structure 140. In another embodiment, the semiconductor layer 240 may include further regions or discrete films, and thus, the layers 242 and 244 may be spaced apart from each other.

Figure 3:
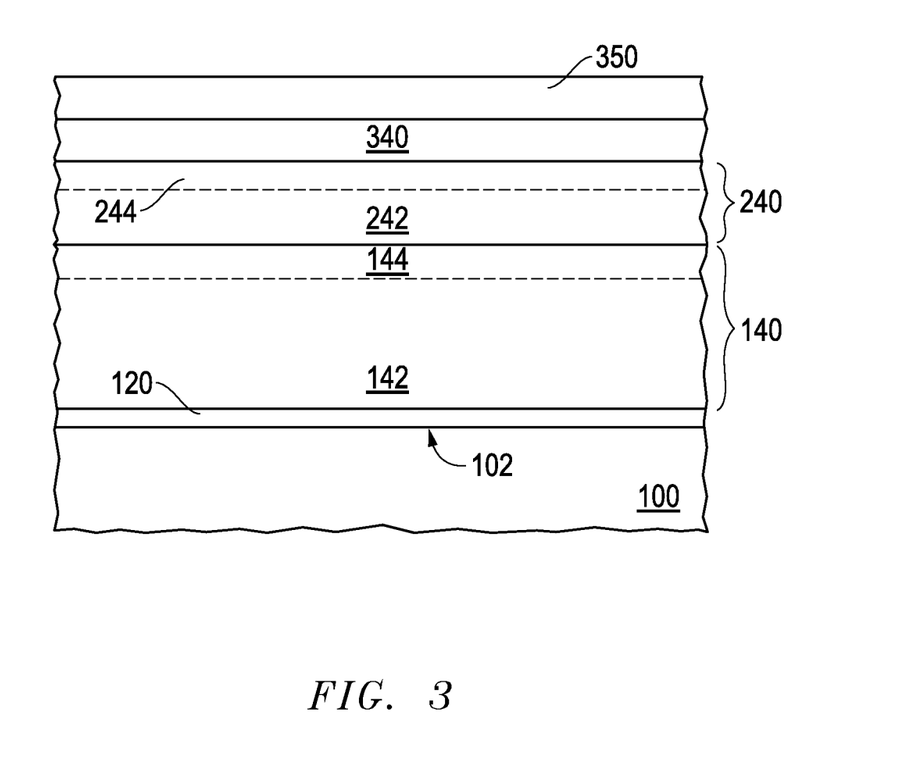
FIG. 3 includes an illustration of a cross-sectional view of the workpiece of FIG. 2 after forming a channel layer and a barrier layer over the semiconductor layer.

In FIG. 3, a channel layer 340 is formed over the semiconductor layer 240, and a barrier layer 350 is formed over the channel layer 340. The carrier barrier layer 244 is disposed between and abuts the carrier accumulation layer 242 and the channel layer 340 in the embodiment as illustrated.

The nucleation layer 120, the superlattice structure 140, the semiconductor layer 240, and channel layer 340, the barrier layer 350, or any combination thereof can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like. In a particular embodiment, the semiconductor layer 240 is epitaxially grown from the superlattice structure 140, the channel layer 340 is epitaxially grown from the semiconductor layer 240, and the barrier layer is epitaxially grown from the channel layer 340. The epitaxial growth can be performed as a chemical vapor deposition using an organometallic compound, a hydride, or a halide. In a particular embodiment, an alkyl compound may be used. For example, a gallium source may include $Ga(C_xH_{2x+1}))_3$, where x is 1 to 3. A nitrogen source can include $NH_3$ or $N_2H_4$. Carrier impurities, such as acceptors or donors, may be incorporated from one or more of the sources (for example, C from the Ga source gas) or may be separately added if needed or desired. When the channel layer 340 includes GaN, acceptors can include Be, C, Mg, Zn, Cd, or any combination thereof, and donors can include Si, Ge, or any combination thereof.

The composition and thickness of the layers 140, 240, and 350 may depend on the composition of the channel layer 340. The channel layer 340 will be first described followed by the semiconductor layer 240, the region 144 of the superlattice structure 140, and the barrier layer 350. While some details are specific for a GaN channel layer, after reading the specification, skilled artisans will be able to make embodiments that meet their needs or desires, even if the composition of the channel layer 340 is not GaN.

The channel layer 340 includes a semiconductor material, such as a III-V semiconductor material or a II-VI semiconductor material. In an embodiment, the channel layer 340 includes a III-V semiconductor material. In another embodiment, the semiconductor material includes a single Group 13 element, or in another embodiment, includes at least two different Group 13 elements. In a particular embodiment, the semiconductor material is $Al_zGa_{(1-z)}N$, wherein $0 \leq z < 1$, and in a more particular embodiment, $z=0$ (the semiconductor material is GaN).

The carrier impurities can be carrier traps within the channel layer 340 and may be acceptors or donors. A high density two dimensional electron gas (2DEG) can be formed near the interface of barrier layer 350 and the channel layer 340, and is responsible for high mobility and lower resistivity of the transistor. Any reduction of the 2DEG electrons will increase the on-resistance of the transistor. In an embodiment, the acceptors can trap the electrons in the channel layer 340 due to high electron density at the beginning. Once the device is in an off state, high electric fields from the gate edge, field plate edges, and drain edge can de-trap the electrons from the acceptor traps, and these de-trapped electrons can be driven toward the underlying layers. Thus, the concentration of acceptors (when the carriers are electrons) or donors (when the carriers are holes) may be kept as low as reasonably possible. In a particular embodiment, acceptors can include carbon from a source gas when metalorganic chemical vapor deposition (MOCVD) is used to form the channel layer 340. Some carbon can become incorporated as the channel layer 340 is grown. The carbon content may be controlled by controlling the deposition conditions, such as the deposition temperature and flow rates.

In an embodiment, the channel layer 340 has a carrier impurity concentration that is at least $1 \times 10^{13}$ atoms/cm$^3$, less than $1 \times 10^{14}$ atoms/cm$^3$, less than $1 \times 10^{15}$ atoms/cm$^3$, or at less than $5 \times 10^{15}$ atoms/cm$^3$, and in another embodiment, no greater than $3 \times 10^{16}$ atoms/cm$^3$. In a further embodiment, the carrier impurity concentration is in a range of $1 \times 10^{13}$ atoms/cm$^3$ to $3 \times 10^{16}$ atoms/cm$^3$. In a particular embodiment, the lowest trap concentration is desired but may be limited by growth or deposition conditions and purity of the precursors.

In an embodiment, the channel layer 340 has a thickness that is at least 50 nm, at least 110 nm, or at least 200 nm. When the thickness is less than 50 nm, a DEG2 may be more difficult to generate, maintain, or both. In another embodiment, the channel layer 340 has a thickness that is no greater than 5000 nm, no greater than 2000 nm, no greater than 900 nm, no greater than 550 nm, or no greater than 300 nm. In a particular embodiment, the effectiveness of the back barrier to confine carriers may be reduced as the thickness of the channel layer is greater than 550 nm. In a further embodiment, the channel layer 340 has a thickness is in a range of 20 nm to 2000 nm, 50 nm to 550 nm, or 110 nm to 300 nm. In a particular embodiment, the thickness in a range of 110 nm to 300 nm can provide sufficiently thick channel layer 340 to allow for the proper generation and maintaining of the 2DEG and still obtain a reasonable static $R_{DSON}$ and effectiveness of the back barrier.

The charge barrier layer 244 of the semiconductor layer 240 can be a barrier to help keep carriers within the channel layer 340. The charge barrier layer 244 can include a semiconductor material, such as a III-V semiconductor material or a II-VI semiconductor material. The bandgap energy, the carrier impurity concentration, or both for the charge barrier layer 244 can be selected to help keep carriers, particularly de-trapped carriers, to stay confined within the channel layer 340. In an embodiment the semiconductor material of the channel layer 340 has a bandgap energy that can be at a lower energy as compared to the semiconductor material of the charge barrier layer 244. The higher bandgap energy of the semiconductor material of the charge barrier layer 244 helps to make the transition of carriers from the channel layer 340 to the charge barrier layer 244 energetically less favored.

In another embodiment, the carrier impurity concentration may be used instead of or in conjunction with the adjustment of the bandgap energy. On a relative basis, the channel layer 340 can have a concentration of the carrier impurities (acceptors or donors) that is the same or less than the concentration of the carrier impurity of the same type (acceptors or donors) within the charge barrier layer 244. A lower carrier impurity concentration in the charge barrier layer 244 allows for fewer carrier traps, and therefore, should carriers become de-trapped from charge barrier layer 244, there are fewer de-trapped carriers migrating into the channel layer 340 as compared to when the charge barrier layer 244 has a higher carrier impurity concentration.

In an alternative embodiment, the channel layer 340 can have a carrier impurity concentration that is less than the carrier impurity concentration within the charge barrier layer 244. In a particular example, the semiconductor material of the charge barrier layer 244 may be selected such that migration of a carrier from the channel layer 340 to the charge barrier layer 244 is energetically less favored. Thus, a higher carrier impurity concentration in the charge barrier layer 244 can be tolerated due to the dissimilarities in energies of the conduction or valence bands for the semiconductor materials of the charge barrier layer 244 and the channel layer 340. In a further embodiment, the carrier impurity concentrations of the charge barrier layer 244 and the channel layer may be substantially equal.

With respect to semiconductor composition, the charge barrier layer 244 can have include $Al_yGa_{(1-y)}N$, wherein $0<y<1$. In an embodiment, y is at least 0.001, at least 0.05, at least 0.08, at least 0.10, or at least 0.12, and in another embodiment, y is no greater than 0.50, no greater than 0.30, no greater than 0.20, or no greater than 0.12. In a further embodiment, y is in a range of 0.0001 to 0.50, 0.05 to 0.30, 0.08 to 0.20, or 0.08 to 012. In a particular embodiment, y in a range of 0.08 to 0.12 allows for a sufficiently greater bandgap energy as compared to the channel layer 340 and keeps lattice mismatch to the channel layer 340 low.

In an embodiment, the charge barrier layer 244 has a concentration of a carrier impurity that is at least $1 \times 10^{13}$ atoms/cm$^3$, at least $1 \times 10^{14}$ atoms/cm$^3$, at least $\times 10^{15}$ atoms/cm$^3$, or at least $5 \times 10^{15}$ atoms/cm$^3$, and in another embodiment, the charge barrier layer 244 has a concentration of a carrier impurity that is no greater than $5 \times 10^{18}$ atoms/cm$^3$, no greater than $1 \times 10^{18}$ atoms/cm$^3$, no greater than $1 \times 10^{17}$ atoms/cm$^3$, or no greater than $5 \times 10^{16}$ atoms/cm$^3$. In a further embodiment, the charge barrier layer 244 has a concentration of a carrier impurity in a range of $1 \times 10^{13}$ atoms/cm$^3$ to $5 \times 10^{18}$ atoms/cm$^3$, $1 \times 10^{14}$ atoms/cm$^3$ to $1 \times 10^{18}$ atoms/cm$^3$, $1 \times 10^{15}$ atoms/cm$^3$ to $1 \times 10^{17}$ atoms/cm$^3$, or $5 \times 10^{15}$ atoms/cm$^3$ to $5 \times 10^{16}$ atoms/cm$^3$.

Regarding thickness, in an embodiment, the charge barrier layer 244 has a thickness that is at least 50 nm, at least 110 nm, at least 200 nm, or at least 600 nm, and in another embodiment, the charge barrier layer 244 has a thickness that is no greater than 5000 nm, no greater than 2000 nm, no greater than 1500 nm, or no greater than 900 nm. In a further embodiment, the charge barrier layer 244 has a thickness is in a range of 50 nm to 5000 nm, 110 nm to 2000 nm, 200 nm to 1500 nm, or 600 nm to 900 nm. In an embodiment, the charge barrier layer 244 has a thickness greater than the thickness of the channel layer 340. In another embodiment, the charge barrier layer 244 has a thickness that is substantially the same or less than the thickness of the channel layer 340. In a particular embodiment, a thickness in a range of 600 nm to 900 nm can allow for a good balance between sufficiently thin, so that carriers can migrate from the channel layer 340, but not so thin that carriers from the charge accumulation layer 242 can easily migrate into the channel layer 340.

The charge accumulation layer 242 of the semiconductor layer 240 can help to collect de-trapped carriers from the charge barrier layer 244 or the channel layer 340. The charge accumulation layer 242 can have a different composition as compared to the charge barrier layer 244 or the channel layer 340. For example, the different compositions may include at least one different element, different content levels of one or more elements, or both. The charge accumulation layer 242 can include a semiconductor material, such as a III-V semiconductor material or a II-VI semiconductor material. The bandgap energy, the carrier impurity concentration, or both of the charge accumulation layer 242 can be selected to help keep carriers, particularly de-trapped carriers, confined within the channel layer 340. If carriers migrate to the charge accumulation layer 242, such carriers should remain with the charge accumulation layer 242. When carriers accumulate within the charge accumulation layer 242, such accumulated carriers may help to repel carriers within the channel layer 340 away from the charge barrier layer 244, and therefore, can also help to confine carriers within the channel layer 340 and reduce the likelihood of carriers entering the charge barrier layer 244.

The semiconductor material of the charge barrier layer 244 can have a bandgap energy that is substantially the same as a bandgap energy of the semiconductor material of the charge accumulation layer 242. In this embodiment, de-trapped electrons or holes do not have to overcome an energy barrier to enter the charge accumulation layer 242 from the charge barrier layer 244. In a particular alternative embodiment, the bandgap energy of the semiconductor material of the charge accumulation layer 242 can be less than the bandgap energy of the semiconductor material of the charge barrier layer 244.

In a different embodiment, the bandgap energy of the semiconductor material of the charge accumulation layer 242 can be higher than the bandgap energy of the semiconductor material of the charge barrier layer 244. In either of these embodiments, the bandgap energy of the charge accumulation layer 242 should not be too far from the bandgap energy of the charge barrier layer 244, the channel layer 340, or both.

In the previously described embodiments, carriers are energetically favored to stay within the channel layer 340, rather than migrate into the charge barrier layer 244. In another embodiment, the semiconductor material of the charge barrier layer 244 can have a bandgap energy that is substantially the same as a bandgap energy of the channel layer 340. De-trapped carriers from the charge barrier layer 244 are energetically more favored to enter the charge barrier layer 242 as compared to the channel layer 340.

In an embodiment, the charge accumulation layer 242 can include a III-V semiconductor material having at least two different Group 13 elements. In a particular embodiment, the charge accumulation layer 242 includes $Al_xGa_{(1-x)}N$, wherein $0 \leq x < 1$. When x=0, the semiconductor material includes GaN. In an embodiment, x is at least 0.001, at least 0.05, at least 0.08, at least 0.10, or at least 0.12, and in another embodiment, y is no greater than 0.50, no greater than 0.30, no greater than 0.20, or no greater than 0.12. In a further embodiment, x is in a range of 0.0001 to 0.50, 0.05 to 0.30, 0.08 to 0.20, or 0.08 to 012. In a particular embodiment, y in a range of 0.08 to 0.12 allows for a sufficiently greater bandgap energy as compared to the channel layer 340 and keeps lattice mismatch to the charge barrier layer 244 low.

The charge accumulation layer 242 can have a higher carrier impurity concentration as compared to the charge barrier layer 244. In an embodiment, the charge accumulation layer 242 has a carrier impurity at a concentration of at least $1 \times 10^{19}$ atoms/cm$^3$, at least $2 \times 10^{19}$ atoms/cm$^3$, or at least $5 \times 10^{19}$ atoms/cm$^3$, and in another embodiment, the charge accumulation layer 242 has a carrier impurity at a concentration of no greater than $1 \times 10^{21}$ atoms/cm$^3$.

In an embodiment, the charge accumulation layer 242 has a thickness that is at least 50 nm, at least 110 nm, or at least 200 nm, and in another embodiment, the charge accumulation layer 242 has a thickness that is no greater than 1500 nm, no greater than 900 nm, no greater than 600 nm, or no greater than 300 nm. In a further embodiment, the region has a thickness is in a range of 50 nm to 1500 nm, 110 nm to 900 nm, 110 nm to 600 nm, or 200 nm to 300 nm. In a particular embodiment, the charge barrier layer 244 is thicker than the charge accumulation layer 242. Such an embodiment may be useful to keep the total number of traps in the charge accumulation layer 242 from getting too high. The charge accumulation layer 242 can have a thickness that is the same, greater than or less than the thickness of the channel layer 340. In a particular embodiment, a thickness in a range of 200 nm to 300 nm allows a sufficient thickness to accumulate sufficient charge and still be thin enough to have sufficient charge to repel carriers within the channel layer 340, so that carriers are more likely at the surface of the channel layer 340 opposite the surface that abuts the carrier barrier layer 242, which in turns helps with the generation and maintaining of the 2DEG.

The region 144 of the superlattice structure can have a composition that aids in the functionality of the layer 240. The region 144 may have some design considerations that are similar to the charge barrier layer 244 of the semiconductor layer 240. The region 144 can include a semiconductor material, such as a III-V semiconductor material or a II-VI semiconductor material. The bandgap energy, the carrier impurity concentration, or both of the region 144 can be selected to help keep carriers, particularly de-trapped carriers, to stay confined within the semiconductor layer 240. In an embodiment where the carriers are electrons, the semiconductor material of the region 144 has a bandgap energy that greater the bandgap energy of the semiconductor material of the charge barrier layer 244. The greater bandgap energy of the semiconductor material of the region 144 helps to make the transition from the charge accumulation layer 242 to the region 144 energetically less favored.

In another embodiment, the carrier impurity concentration may be used instead of or in conjunction with the adjustment of the bandgap energy. On a relative basis, the region 144 can have a concentration of the carrier impurity (acceptors or donors) that is less than the concentration of the carrier impurity of the same type (acceptors or donors) within the charge accumulation layer 242. A lower carrier impurity concentration in the region 144 allows for fewer carrier traps.

In an alternative embodiment, the region 144 can have a carrier impurity concentration that is greater than the carrier impurity concentration within the charge accumulation layer 242. In a particular example, the semiconductor material of the region 144 may be selected such that migration of a carrier from the charge accumulation layer 242 to the region 144 is energetically less favored. Thus, a higher carrier impurity concentration in the region 144 can be tolerated due to the dissimilarities in energies of the conduction or valence bands for the semiconductor materials of the region 144 and the charge accumulation layer 242. In a further embodiment, the carrier impurity concentrations of the region 144 and the charge accumulation layer 242 may be substantially equal.

With respect to the charge barrier layer 244, the region 144 may have a semiconductor material with a bandgap energy that is the same as or greater than the bandgap energy of the charge barrier layer 244. The carrier impurity concentration and thickness of the region 144 may depend more on the design of the remainder of the superlattice structure 120 and the voltage that the superlattice structure 120 is designed to support. The region 144 can have any of the thicknesses as previously described with respect to the charge barrier layer 244. The thicknesses of the regions 144 and 244 can be the same or different.

Turning to the opposite side of the channel layer 340, the barrier layer 350 can abut the channel layer 340, as illustrated in FIG. 3. The barrier layer 350 can include a III-V semiconductor material or a II-VI semiconductor material. In an embodiment, the barrier layer 350 includes at least two different Group 13 elements. In another embodiment, the barrier layer 350 can includes $Al_wGa_{(1-w)}N$, wherein $0 < w < 1$. In a particular embodiment, w is at least 0.009, at least 0.05, at least 0.11, or at least 0.15, and in another particular embodiment, w is no greater than 0.50, no greater than 0.40, or no greater than 0.30. In a particular embodiment, w is in a range of 0.0009 to 0.50, 0.05 to 0.40, or 0.15 to 0.30.

In an embodiment, the barrier layer 350 has a carrier impurity concentration that is at least $1 \times 10^{13}$ atoms/cm$^3$, at least $1 \times 10^{14}$ atoms/cm$^3$, at least $1 \times 10^{15}$ atoms/cm$^3$, or at least $5 \times 10^{15}$ atoms/cm$^3$, and in another embodiment, the carrier impurity concentration is no greater than $5 \times 10^{18}$ atoms/cm$^3$, no greater than $1 \times 10^{18}$ atoms/cm$^3$, no greater than $1 \times 10^{17}$ atoms/cm$^3$, or no greater than $5 \times 10^{16}$ atoms/cm$^3$. In a further embodiment, the carrier impurity concentration is in a range of $1 \times 10^{13}$ atoms/cm$^3$ to $5 \times 10^{18}$ atoms/cm$^3$, $1 \times 10^{14}$ atoms/cm$^3$ to $1 \times 10^{18}$ atoms/cm$^3$, $1 \times 10^{15}$ atoms/cm$^3$ to $1 \times 10^{17}$ atoms/cm$^3$, or $5 \times 10^{15}$ atoms/cm$^3$ to $5 \times 10^{16}$ atoms/cm$^3$. In an embodiment, the carrier impurity concentration in the barrier layer 350 can be selected to maintain the strain of the barrier layer 350 by acceptors, such as carbon, due to the higher cohesive energy of such an acceptor. In another embodiment, similar effects may be seen with other carrier impurities.

In an embodiment, the barrier layer 350 has a thickness that is at least 0.5 nm, at least 5 nm, at least 11 nm, or at least 20 nm, and in another embodiment, the barrier layer 350 has a thickness that is no greater than 200 nm, no greater than 150 nm, no greater than 90 nm, or no greater than 40 nm. In a further embodiment, the barrier layer 350 has a thickness is in a range of 0.5 nm to 200 nm, 5 nm to 40 nm.

Figure 4:
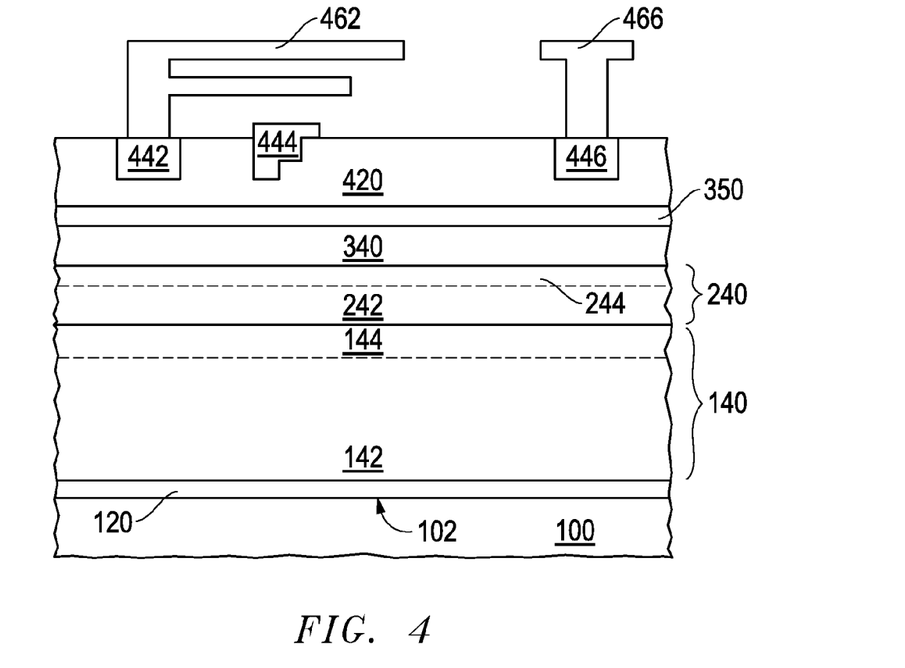
FIG. 4 includes an illustration of a cross-sectional view of the workpiece of FIG. 3 after forming a substantially completed transistor.

Processing can be continued to form a substantially completed transistor as illustrated in FIG. 4. An insulating layer 420 can be formed over the barrier layer 350 and can include one or more insulating films. In an embodiment, the insulating layer 420 can include a nitride compound, such as silicon nitride, aluminum nitride, or the like. The insulating layer 420 may include an oxide film. If oxide is incompatible or causes a processing or other issue with the channel layer 340 or an underlying layer, a film of a different composition may be formed before the oxide. In a particular embodiment, a film within the gate dielectric layer may include a nitride and can be partly oxidized to form the oxide layer.

Portions of the insulating layer 420 can be removed at locations to form a gate well and openings for source and drain electrodes. The openings for the source and drain electrodes may terminate within the insulating layer 420 (illustrated), within the barrier layer 350 or extend through both the insulating layer 420 and the barrier layer 350. The gate well may terminate within the insulating layer 420 (illustrated) or extend into the barrier layer 350. The gate well does not extend to the channel layer 340. The source electrode 442, the gate electrode 444, and the drain electrode 446 are then formed. In the embodiment as illustrated, the barrier layer 350 is disposed between the channel layer 340 and the gate electrode 444. The portions of the gate electrode 444 that are further from the channel layer 340 and closer to the drain electrode 446 act as a shield plate to reduce the gate-to-drain capacitance. The portions of the source electrode 442 that extend over the gate electrode and toward to the drain electrode 446 act as a shield plate to reduce the gate-to-drain capacitance. Interconnects 462 and 466 are formed that are electrically connected to the source electrode 442 and the drain electrode 446, respectively. Although not illustrated, an interconnect to the gate electrode 444 is also formed. Although not illustrated, one or more additional insulating layers, conductive plugs, and interconnect levels can be formed if needed or desired. Further, additional transistors may be formed. In a particular embodiment, a plurality of the transistors can be connected in parallel to provide an equivalent transistor having a sufficiently large channel width to support high current flow when the transistor is on.

Figure 5:
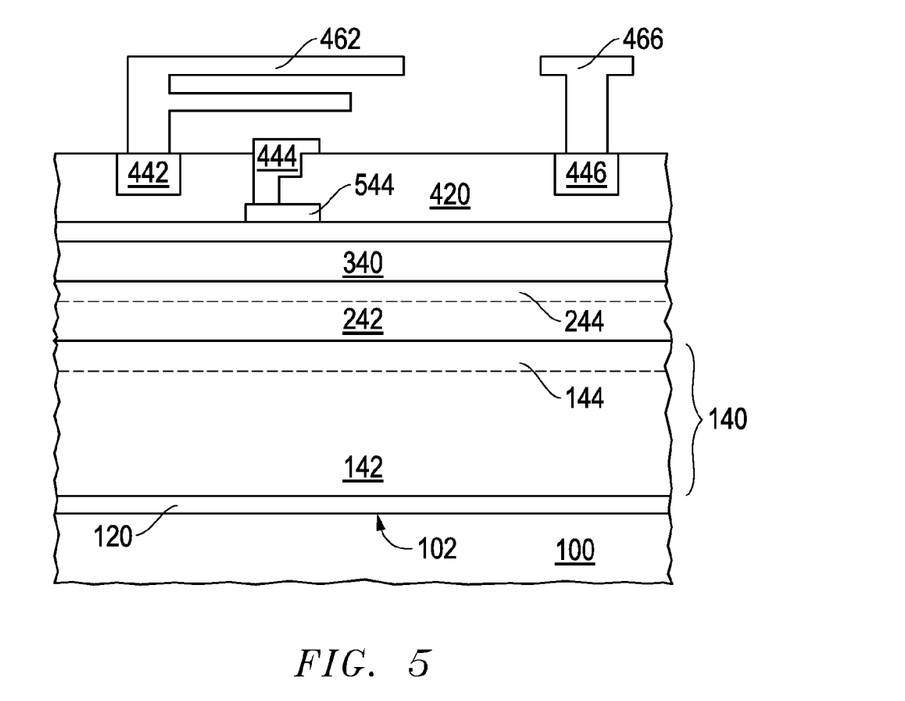
FIG. 5 includes an illustration of a cross-sectional view of a portion of a workpiece similar to one the illustrated in FIG. 4 except that the transistor structure is an enhancement-mode transistor.

FIG. 4 includes an illustration of a depletion-mode transistor. In another embodiment, an enhancement-mode transistor can be formed, as illustrated in FIG. 5. In FIG. 5, a layer 544 having a carrier type that is the same as the channel layer 340 can be formed. In a particular embodiment, the layer 544 includes $Al_aGa_{(1-a)}N$, wherein 0<a<1. If the carrier impurities in the channel layer 340 are acceptors, the layer 544 also includes acceptors, and if the carrier impurities in the channel layer 340 are donors, the layer 544 also includes donors.

Figure 6:
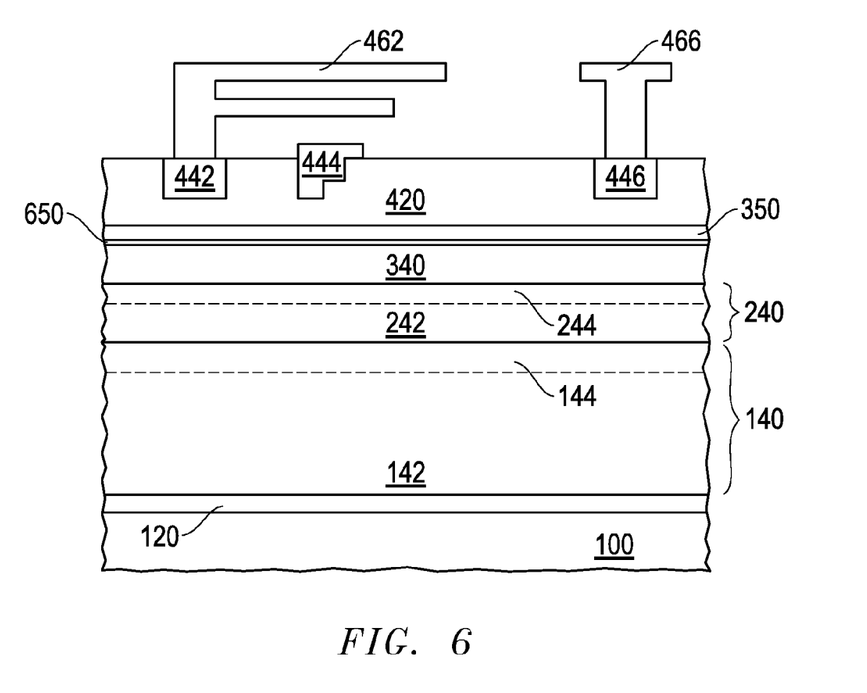
FIG. 6 includes an illustration of a cross-sectional view of a portion of a workpiece similar to one the illustrated in FIG. 4 except that a spacer layer is disposed between the channel layer and the barrier layer.
Figure 7:
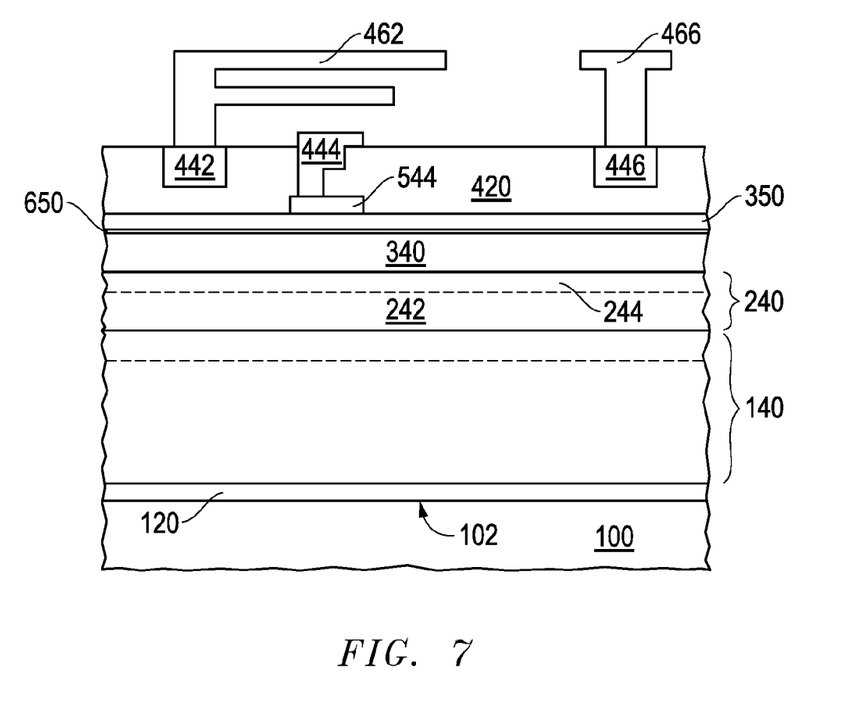
FIG. 7 includes an illustration of a cross-sectional view of a portion of a workpiece similar to one the illustrated in FIG. 5 except that a spacer layer is disposed between the channel layer and the barrier layer.

FIGS. 6 and 7 include embodiments in which a spacer layer 650 is disposed between the barrier layer 350 and the channel layer 340. The spacer layer 650 can include a III-V semiconductor material or a II-VI semiconductor material. In an embodiment, the spacer layer 350 includes at least two different Group 13 elements. In another embodiment, the spacer layer 650 can includes $Al_bGa_{(1-b)}N$, wherein 0<b<1. In a particular embodiment, z is at least 0.40, at least 0.50, or at least 0.60, and in another particular embodiment, b is no greater than 1.00, no greater than 0.90, or no greater than 0.80. In a particular embodiment, b is in a range of 0.04 to 1.00, 0.50 to 0.90, or 0.60 to 0.80. In a further embodiment, the spacer layer 650 has a higher Al content as compared to the barrier layer 350.

In an embodiment, the spacer layer 650 has a carrier impurity concentration that is at least $1\times10^{13}$ atoms/$cm^3$, at least $1\times10^{14}$ atoms/$cm^3$, at least $1\times10^{15}$ atoms/$cm^3$, or at least $5\times10^{15}$ atoms/$cm^3$, and in another embodiment, the carrier impurity concentration is no greater than $5\times10^{18}$ atoms/$cm^3$, no greater than $1\times10^{18}$ atoms/$cm^3$, no greater than $1\times10^{17}$ atoms/$cm^3$, or no greater than $5\times10^{16}$ atoms/$cm^3$. In a further embodiment, the carrier impurity concentration is in a range of $1\times10^{13}$ atoms/$cm^3$ to $5\times10^{18}$ atoms/$cm^3$, $1\times10^{14}$ atoms/$cm^3$ to $1\times10^{18}$ atoms/$cm^3$, $1\times10^{15}$ atoms/$cm^3$ to $1\times10^{17}$ atoms/$cm^3$, or $5\times10^{15}$ atoms/$cm^3$ to $5\times10^{16}$ atoms/$cm^3$. In an embodiment, the carrier impurity concentration in the spacer layer 650 can be selected to maintain the strain of the spacer layer 650 by acceptors, such as carbon, due to the higher cohesive energy of such an acceptor. In another embodiment, similar effects may be seen with other carrier impurities.

In an embodiment, the spacer layer 650 is thinner than the barrier layer 350 has a thickness that is at least 2 nm, at least 5 nm, or at least 7 nm, and in another embodiment, the spacer layer 650 has a thickness that is no greater than 90 nm, no greater than 50 nm, or no greater than 20 nm. In a further embodiment, the spacer layer 650 has a thickness is in a range of 2 nm to 50 nm, 5 nm to 20 nm.

Figure 8:
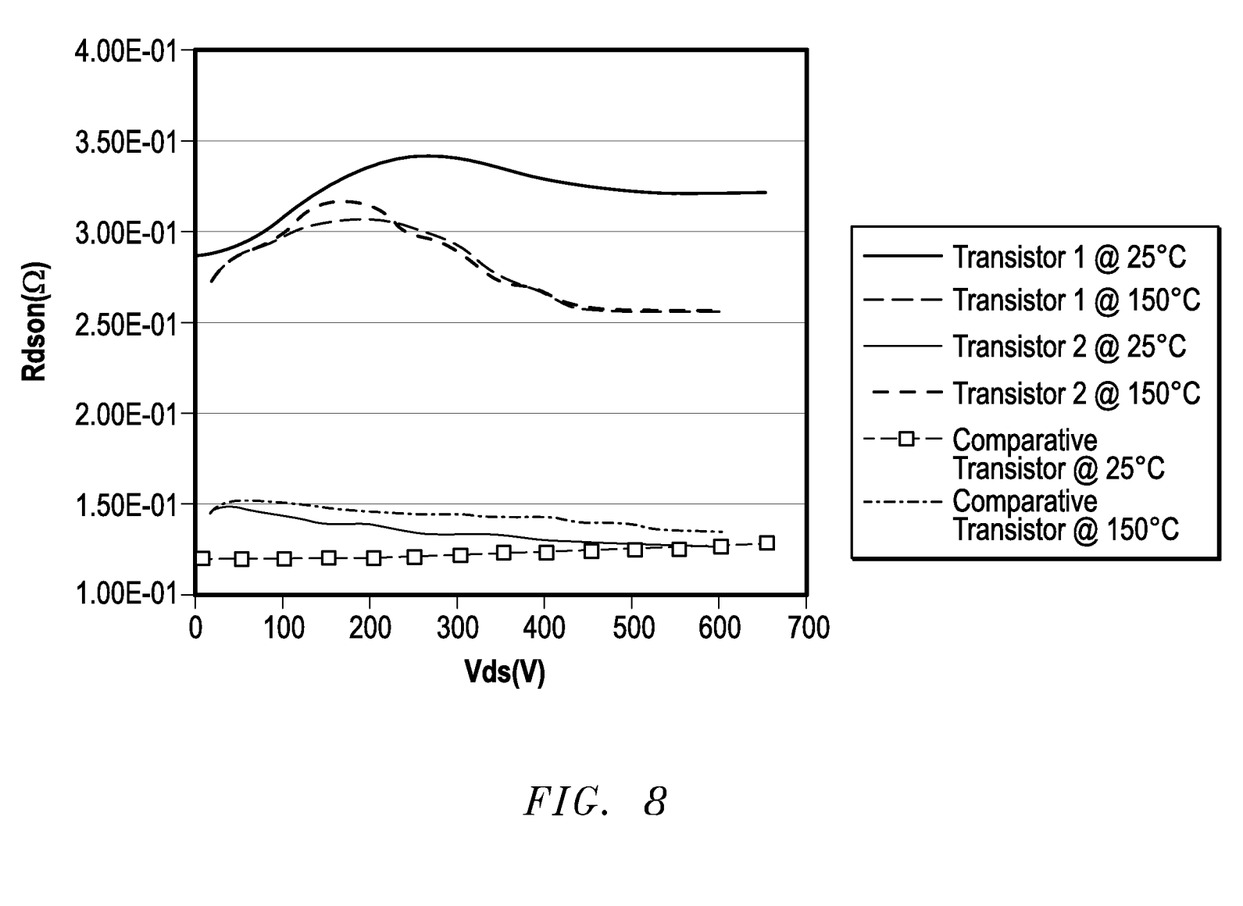
FIG. 8 includes a plot of on-resistance versus drain-to-source voltage at 25° C. and 150° C. for different transistors.

The transistors as described herein have unexpectedly good $R_{DSON}$ when the transistors are at elevated temperatures (for example, higher than 40° C.). FIG. 8 includes a plot of dynamic $R_{DSON}$ as a function of $V_{DS}$ when transistors are at 25° C. and at 150° C. The devices are stressed at different $V_{DS}$ and after each $V_{DS}$ stressing, the device is turned on to measure on-resistance. At 25° C., the transistors have an $R_{DSON}$ between 0.10 ohms to 0.15 ohms when $V_{DS}$ is in a range of 0 V to 600V. At 150° C., the difference between the different transistors becomes more apparent. Transistors 1 and 2 are embodiments as described herein and reach a maximum on-resistance ($R_{DSON-max}$) at a lower voltage and a lower $R_{DSON}$ at the same voltage as compared to a comparative transistor.

In particular, at 150° C., the Transistors 1 and 2 reach $R_{DSON}$-max when $V_{DS}$ is no higher than about 190 V. Above 190 V, $R_{DSON}$ decreases until about 450 V and then remains at about the same value. Thus, $R_{DSON}$ at 190 V is higher than $R_{DSON}$ when $V_{DS}$ is 200 V, 220 V, 240 V, or 260 V. The comparative transistor does not reach $R_{DSON-max}$ until $V_{DS}$ is about 270 V.

After $R_{DSON-max}$ is reached, $R_{DSON}$ decreases more as $V_{DS}$ increases for the Transistors 1 and 2 as compared to the comparative transistor. The lower $R_{DSON}$ can be quantified by resistance reduction, which is calculated using the formula below.

$$((R_{DSON-max} - R_{DSON-VDS})/(R_{DSON-max}))*100\%,$$

For the comparative transistor, the resistance reduction is less than 1.5% at $V_{DS}$=300 V, less than 3.0% at $V_{DS}$=400 V, and less than 5.2% for each of $V_{DS}$=500 V and $V_{DS}$=600 V. For the Transistors 1 and 2, the resistance reduction is greater. In a particular embodiment, at $V_{DS}$=300 V, the resistance reduction is at least is at least 2%, at least 4%, or at least 6%; the resistance reduction is at $V_{DS}$=400 V, the resistance reduction is at least is at least 3%, at least 7%, or at least 10%; the resistance reduction is at $V_{DS}$=500 V, the resistance reduction is at least is at least 6%, at least 14%, or at least 20%; the resistance reduction is at $V_{DS}$=600 V, the resistance reduction is at least is at least 6%, at least 14%, or at least 20%; or any combination thereof. Thus, embodiments as described herein have substantially better on-current properties and can allow more current to pass through the transistor when it is on. In a particular embodiment, when $V_{DS}$ is 300 V, Transistors 1 and 2 may have a resistance reduction that is no greater than 10%, when $V_{DS}$ is 400 V, the resistance reduction may be no greater than 20%, when $V_{DS}$ is 500 V, the resistance reduction may be no greater than 35%, when $V_{DS}$ is 600 V, the resistance reduction may be no greater than 35%, or any combination thereof.

The semiconductor layer 240 can help to keep carriers within the channel layer 340 and can allow de-trapped carriers from migrating into the channel layer 340. Accordingly, the leakage current (when the transistor is off) can be less than for a comparative device.

The description above addresses some exemplary embodiments. Other embodiments can be used without departing from the scope of the present invention. The channel layer is not limited to GaN, the semiconductor layer and the superlattice structure are not limited to $Al_zGa_{(1-z)}N$. Other compound semiconductor materials, such as III-V (such as, III-N and Group 13-Group 15 semiconductor compounds) and II-VI semiconductor materials can be used. The particular selection of materials can be guided as least in part on the considerations as described above regarding energy levels of the conduction bands (for acceptors) and valence bands (for donors) and carrier impurity concentrations for the layers, films, and regions. In a particular embodiment, a channel layer can include a III-V semiconductor material, and any one or more of the semiconductor layer (carrier barrier region, the carrier accumulation region, or both) and the superlattice structure can include a II-VI semiconductor material. Such combination of materials may be used provided the channel layer can be formed as a monocrystalline layer and the superlattice structure can support the normal operating voltages.

Within any particular region or layer, the carrier impurity concentration profile may be uniform or continuously graded.

The transistor illustrated in FIG. 4 is a metal-insulator-semiconductor field-effect transistor (MISFET). Thus, a gate dielectric layer is disposed between the channel layer and the gate electrode. In another embodiment, the transistor can be a junction field-effect transistor (JFET) where no gate dielectric layer is present between the channel layer and the gate electrode. In a particular embodiment, the gate electrode directly contacts the channel layer.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include a substrate, a carrier accumulation layer overlying the substrate, a carrier barrier layer overlying the carrier accumulation layer, and a channel layer of a transistor overlying the carrier barrier layer, wherein the channel layer includes a compound semiconductor material and has a thickness in a range of 50 nm to 550 nm.

Embodiment 2

The electronic device of embodiment 1, wherein the channel layer includes GaN; and the carrier accumulation layer, the carrier barrier layer, or each of the carrier accumulation layer and the carrier barrier layer includes $Al_xGa_{(1-x)}N$, wherein x is in a range of 0.01 to 0.49.

Embodiment 3

The electronic device of embodiment 2, wherein each of the carrier accumulation layer and the carrier barrier layer includes $Al_xGa_{(1-x)}N$, wherein x is in a range of 0.08 to 0.12, and the carrier accumulation has a greater concentration of a carrier impurity as compared to the carrier barrier layer.

Embodiment 4

The electronic device of embodiment 2, wherein the carrier accumulation layer has a higher concentration or donors or acceptors as compared to the carrier barrier layer.

Embodiment 5

The electronic device of embodiment 1, wherein the carrier accumulation layer has a first bandgap energy, the carrier barrier layer has a second bandgap energy, the channel layer has a third bandgap energy, and the second bandgap energy is greater than the third bandgap energy.

Embodiment 6

The electronic device of embodiment 5, wherein the second bandgap energy is greater than the first bandgap energy.

Embodiment 7

The electronic device of embodiment 6, wherein the carrier accumulation layer includes GaN and has a thickness no greater than 900 nm.

Embodiment 8

The electronic device of embodiment 1, wherein the carrier barrier layer is at least 1.5 times thicker than the carrier accumulation layer.

Embodiment 9

The electronic device of embodiment 1, further including a barrier layer overlying the channel layer.

Embodiment 10

The electronic device of embodiment 9, wherein each of the carrier accumulation layer, the carrier barrier layer, the channel layer, and the barrier layer includes a III-N material.

Embodiment 11

The electronic device of embodiment 10, further including a gate electrode of the transistor, wherein the gate electrode is spaced apart from the channel layer by the barrier layer.

Embodiment 12

The electronic device of embodiment 1, wherein the transistor at 150° C. has a resistance reduction that is given by:

$$((R_{DSON-max} - R_{DSON-VDS})/(R_{DSON-max})) * 100\%,$$

wherein $R_{DSON-max}$ is a maximum on-state resistance a drain-to-source voltage is in a range of 0 to 700 V, and $R_{DSON-VDS}$ is an on-state resistance at a particular drain-to-source voltage ($V_{DS}$); and wherein:

when $V_{DS}$ is 300 V, the resistance reduction is at least 2%;

when $V_{DS}$ is 400 V, the resistance reduction is at least 3%;

when $V_{DS}$ is 500 V, the resistance reduction is at least 6%;

when $V_{DS}$ is 600 V, the resistance reduction is at least 6%; or any combination thereof.

Embodiment 13

The electronic device of embodiment 12, wherein:

when $V_{DS}$ is 300 V, the resistance reduction is no greater than 10%;

when $V_{DS}$ is 400 V, the resistance reduction is no greater than 20%;

when $V_{DS}$ is 500 V, the resistance reduction is no greater than 35%;

when $V_{DS}$ is 600 V, the resistance reduction is no greater than 35%; or any combination thereof.

Embodiment 14

The electronic device of embodiment 1, further including:

a barrier layer overlying the channel layer;

a gate electrode of the transistor, wherein the barrier layer is disposed between the channel layer and the gate electrode;

a source electrode of the transistor; and a drain electrode of the transistor, wherein:

the carrier barrier layer abuts each of the carrier accumulation layer and the channel layer;

the carrier accumulation layer includes $Al_xGa_{(1-x)}N$, wherein x is in a range of 0.08 to 0.12, has a concentration of a carrier impurity of a first carrier type that is at least $1 \times 10^{18}$ atoms/cm$^3$, and has a thickness in a range of 200 nm to 300 nm;

the carrier barrier layer includes $Al_xGa_{(1-x)}N$, wherein x is in a range of 0.08 to 0.12, has a concentration of a carrier impurity of the first carrier type that is no greater than $3 \times 10^{16}$ atoms/cm$^3$, and has a thickness in a range of 600 nm to 900 nm;

the channel layer includes GaN, has a concentration of a carrier impurity of the first carrier type that is no greater than $3 \times 10^{16}$ atoms/cm$^3$, and has a thickness in a range of 110 nm to 300 nm; and the barrier layer includes $Al_xGa_{(1-x)}N$, wherein x is in a range of 0.15 to 0.30, and has a thickness in a range of 5 nm to 40 nm.

Embodiment 15

An electronic device can include a substrate, a carrier accumulation region overlying the substrate, a carrier barrier layer overlying the carrier accumulation layer; and a channel layer of a transistor overlying the carrier barrier layer, wherein the channel layer includes GaN, wherein the carrier accumulation layer, the carrier barrier layer, or each of the carrier accumulation layer and the carrier barrier layer includes $Al_xGa_{(1-x)}N$, wherein x is in a range of 0.08 to 0.12.

Embodiment 16

The electronic device of embodiment 15, wherein each of the carrier accumulation layer and the carrier barrier layer includes $Al_xGa_{(1-x)}N$, wherein x is in a range of 0.08 to 0.12.

Embodiment 17

The electronic device of embodiment 16, wherein the carrier accumulation layer is at least 1.5 times thicker than the carrier barrier layer.

Embodiment 18

The electronic device of embodiment 16, wherein the channel region includes GaN.

Embodiment 19

The electronic device of embodiment 18, further including a barrier layer that includes $Al_xGa_{(1-x)}N$, wherein x is in a range of 0.15 to 0.30.

Embodiment 20

An electronic device can include a semiconductor layer and including a II-VI semiconductor material, and a channel layer of a transistor overlying the semiconductor layer and including a III-V semiconductor material.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
    a substrate;
    a carrier accumulation layer overlying the substrate;
    a carrier barrier layer overlying the carrier accumulation layer; and
    a channel layer of a transistor overlying the carrier barrier layer, wherein the channel layer includes a compound semiconductor material comprising GaN and has a thickness in a range of 50 nm to 550 nm,
    wherein the carrier accumulations layer, the carrier barrier layer, or each of the carrier accumulation layer and the carrier barrier layer includes $Al_xGa_{(1-x)}N$, wherein x is in a range of 0.01 to 0.49, and
    wherein the carrier accumulations layer has a higher concentration or donors or acceptors as compared to the carrier barrier layer.

2. The electronic device of claim 1, wherein each of the carrier accumulation layer and the carrier barrier layer includes $Al_xGa_{(1-x)}N$, wherein x is in a range of 0.08 to 0.12, and the carrier accumulation has a greater concentration of a carrier impurity as compared to the carrier barrier layer.

3. The electronic device of claim 1, wherein:
    the carrier accumulation layer has a first bandgap energy;
    the carrier barrier layer has a second bandgap energy;
    the channel layer has a third bandgap energy; and
    the second bandgap energy is greater than the third bandgap energy.

4. The electronic device of claim 3, wherein the second bandgap energy is greater than the first bandgap energy.

5. The electronic device of claim 4, wherein the carrier accumulation layer includes GaN and has a thickness no greater than 900 nm.

6. The electronic device of claim 1, wherein the carrier barrier layer is at least 1.5 times thicker than the carrier accumulation layer.

7. The electronic device of claim 1, further comprising a barrier layer overlying the channel layer.

8. The electronic device of claim 7, wherein each of the carrier accumulation layer, the carrier barrier layer, the channel layer, and the barrier layer includes a III-N material.

9. The electronic device of claim 8, further comprising a gate electrode of the transistor, wherein the gate electrode is spaced apart from the channel layer by the barrier layer.

10. The electronic device of claim 1, wherein the transistor at 150° C. has a resistance reduction that is given by:

$$((R_{DSON-max}-R_{DSON-VDS})/(R_{DSON-max}))*100\%,$$

wherein $R_{DSON-max}$ is a maximum on-state resistance a drain-to-source voltage is in a range of 0 to 700 V, and $R_{DSON-VDS}$ is an on-state resistance at a particular drain-to-source voltage ($V_{DS}$); and
wherein:
    when $V_{DS}$ is 300 V, the resistance reduction is at least 2%;
    when $V_{DS}$ is 400 V, the resistance reduction is at least 3%;
    when $V_{DS}$ is 500 V, the resistance reduction is at least 6%;
    when $V_{DS}$ is 600 V, the resistance reduction is at least 6%; or
    any combination thereof.

11. The electronic device of claim 10, wherein:
when $V_{DS}$ is 300 V, the resistance reduction is no greater than 10%;
when $V_{DS}$ is 400 V, the resistance reduction is no greater than 20%;
when $V_{DS}$ is 500 V, the resistance reduction is no greater than 35%;
when $V_{DS}$ is 600 V, the resistance reduction is no greater than 35%; or
any combination thereof.

12. The electronic device of claim 1, further comprising:
    a barrier layer overlying the channel layer;
    a gate electrode of the transistor, wherein the barrier layer is disposed between the channel layer and the gate electrode;
    a source electrode of the transistor; and
    a drain electrode of the transistor,
    wherein:
        the carrier barrier layer abuts each of the carrier accumulation layer and the channel layer;
        the carrier accumulation layer includes $Al_xGa_{(1-x)}N$, wherein x is in a range of 0.08 to 0.12, has a concentration of a carrier impurity of a first carrier type that is at least $1\times10^{18}$ atoms/cm$^3$, and has a thickness in a range of 200 nm to 300 nm;
        the carrier barrier layer includes $Al_xGa_{(1-x)}N$, wherein x is in a range of 0.08 to 0.12, has a concentration of a carrier impurity of the first carrier type that is no greater than $3\times10^{16}$ atoms/cm$^3$, and has a thickness in a range of 600 nm to 900 nm;
        the channel layer includes GaN, has a concentration of a carrier impurity of the first carrier type that is no greater than $3\times10^{16}$ atoms/cm$^3$, and has a thickness in a range of 110 nm to 300 nm; and
        the barrier layer includes $Al_xGa_{(1-x)}N$, wherein x is in a range of 0.15 to 0.30, and has a thickness in a range of 5 nm to 40 nm.

13. An electronic device comprising:
    a substrate;
    a carrier accumulation region overlying the substrate;
    a carrier barrier layer overlying the carrier accumulation layer; and
    a channel layer of a transistor overlying the carrier barrier layer, wherein the channel layer includes GaN,
    wherein each of the carrier accumulation layer and the carrier barrier layer includes $Al_xGa_{(1-x)}N$, wherein x is in a range of 0.08 to 0.12.

14. The electronic device of claim 13, wherein the carrier accumulation layer is at least 1.5 times thicker than the carrier barrier layer.

15. The electronic device of claim 13, wherein the channel region includes GaN.

16. The electronic device of claim 15, further comprising a barrier layer that includes $Al_xGa_{(1-x)}N$, wherein x is in a range of 0.15 to 0.30.

17. The electronic device of claim 1, wherein the channel layer comprises carbon as a dopant.

18. The electronic device of claim 1, further comprising a superlattice structure comprising $Al_zGa_{(1-z)}N$, where $0 \le z \le 1$.

19. The electronic device of claim 18, wherein the superlattice structure overlies the substrate and, in the superlattice structure, an Al content decreases and a Ga content increases as a distance from the substrate increases.

20. The electronic device of claim 19, wherein a nucleation layer is disposed between the superlattice structure and the substrate.

* * * * *